(12) United States Patent
Vilhar (10) Patent No.: US 9,467,219 B2
(45) Date of Patent: *Oct. 11, 2016

(54) SYSTEMS AND METHODS OF ANTENNA ORIENTATION IN A POINT-TO-POINT WIRELESS NETWORK

(71) Applicant: Aviat U.S., Inc., Santa Clara, CA (US)

(72) Inventor: Robert Vilhar, Ljubljana (SI)

(73) Assignee: Aviat U.S., Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/462,379

(22) Filed: Aug. 18, 2014

(65) Prior Publication Data

US 2014/0357210 A1 Dec. 4, 2014

Related U.S. Application Data

(63) Continuation of application No. 13/584,791, filed on Aug. 13, 2012, now Pat. No. 8,849,288.

(60) Provisional application No. 61/522,619, filed on Aug. 11, 2011.

(51) Int. Cl.
*H04W 40/00* (2009.01)
*H04B 7/08* (2006.01)
(Continued)

(52) U.S. Cl.
CPC ............ *H04B 7/0882* (2013.01); *G01R 29/10* (2013.01); *H01Q 1/1257* (2013.01);
(Continued)

(58) Field of Classification Search
CPC .. H01Q 1/125; H01Q 1/1257; H01Q 3/2605; H01Q 17/001; H01Q 25/002; G01S 3/38; G01S 3/42

USPC ............ 455/7, 25, 446, 562.1, 226.1, 226.4, 455/289
See application file for complete search history.

(56) References Cited

U.S. PATENT DOCUMENTS 3,364,490 A   1/1968 Hannan
3,518,687 A   6/1970 Pocs
(Continued)

FOREIGN PATENT DOCUMENTS

EP   1659813   5/2006

OTHER PUBLICATIONS

International Application No. PCT/US2012/050668, International Search Report and Written Opinion mailed Oct. 22, 2012.
(Continued)

*Primary Examiner* — Duc M Nguyen
(74) *Attorney, Agent, or Firm* — Sheppard, Mullin, Richter & Hampton LLP (57) ABSTRACT

An exemplary method comprises positioning a first antenna to receive a first signal from a second antenna, the second antenna comprising energy absorbing material that functions to expand beamwidth, receiving the first signal from the second antenna, detecting a plurality of gains based on the first signal, repositioning the first antenna relative to the second antenna to a position associated with an acceptable gain based on the first signal, removing at least some of the energy absorbing material from the second antenna to narrow the beamwidth of the second antenna, receiving, by the first antenna, a second signal from the second antenna, detecting a plurality of gains based on the second signal, and repositioning the first antenna relative to the second antenna to a position associated with an increased gain of the plurality of gains based on the second signal, the increased gain being greater than the acceptable gain.

24 Claims, 7 Drawing Sheets

(51) Int. Cl.
   *H01Q 1/12*      (2006.01)
   *G01R 29/10*     (2006.01)
   *H01Q 17/00*     (2006.01)
   *H04B 17/12*     (2015.01)
   *H04B 17/309*    (2015.01)
   *H04W 16/28*     (2009.01)
   *H01Q 25/00*     (2006.01)

(52) U.S. Cl.
   CPC ........... *H01Q 17/001* (2013.01); *H04B 17/12* (2015.01); *H04B 17/309* (2015.01); *H01Q 25/002* (2013.01); *H04W 16/28* (2013.01)

(56) References Cited

U.S. PATENT DOCUMENTS

| | | |
|---|---|---|
| 4,837,576 A | 6/1989 | Schwarz |
| H0001034 H | 3/1992 | Lohrmann |
| 5,929,808 A | 7/1999 | Hassan et al. |
| 6,486,832 B1 | 11/2002 | Abramov et al. |
| 6,611,696 B2 | 8/2003 | Chedester et al. |
| 6,836,675 B2 | 12/2004 | Zhang |
| 7,663,560 B1 | 2/2010 | Butterworth et al. |
| 8,013,790 B2 | 9/2011 | Uno et al. |
| 8,451,171 B1 | 5/2013 | Santoru |
| 8,849,288 B2 | 9/2014 | Vilhar |
| 2002/0090941 A1 | 7/2002 | Zhang |
| 2002/0158801 A1 | 10/2002 | Crilly et al. |
| 2004/0110469 A1 | 6/2004 | Judd et al. |
| 2006/0116092 A1 | 6/2006 | Uno et al. |
| 2008/0088518 A1 | 4/2008 | Charash et al. |
| 2010/0113099 A1 | 5/2010 | Uno et al. |
| 2010/0246476 A1 | 9/2010 | Hethuin et al. |
| 2010/0248672 A1 | 9/2010 | Orlik et al. |
| 2010/0302101 A1 | 12/2010 | Leiba et al. |

OTHER PUBLICATIONS

European Patent Application No. 12821784.1, Search Report mailed Mar. 12, 2015.

FIG. 7

SYSTEMS AND METHODS OF ANTENNA ORIENTATION IN A POINT-TO-POINT WIRELESS NETWORK

CROSS-REFERENCE TO RELATED APPLICATIONS

This application is a continuation of U.S. patent application Ser. No. 13/584,791, filed Aug. 13, 2012 and entitled "Systems and Methods of Antenna Orientation in a Point-To-Point Wireless Network," which claims priority to U.S. Provisional Patent Application Ser. No. 61/522,619, filed Aug. 11, 2011 and entitled "Millimeter Wave Reflector Antenna Orientation Apparatus," which are hereby incorporated by reference herein.

FIELD OF THE INVENTION(S)

The present invention(s) relate to wireless network systems, and more particularly, to systems and methods of antenna orientation in a point-to-point wireless network.

DESCRIPTION OF THE RELATED ART

Wireless antenna systems, such as microwave antenna system, are increasingly common. Large amounts of information may be transmitted at high frequencies between antennas. Point-to-point antenna systems are often used to increase, increase other desirable signal characteristics, and/or allow greater distances between antennas.

In one example, e-band wireless systems may offer full-duplex gigabit Ethernet connectivity at data rates of 1 Gbps and higher. The e-band includes 71-76 and 81-86 GHz bands. Since gain of an antenna increases with frequency, it is possible to realize large gains from small antennas at e-band frequencies. For example, at the e-band of a 30 cm parabolic antenna has a gain of 44 to 45 dBi. An extra 24 dB allows for a significant distance increases between antennas.

Unfortunately, as distances between antennas increase, the difficulty of aligning one or both antennas to achieve point-to-point communication also increases. Weather or other external events may influence gain and/or other signal characteristics. In one example, weather may negatively affect e-band wireless systems resulting to link fading. The degree and severity of link fading may depend on weather type, severity, distances between antennas, type of antennas, gain demands, and the like. As with any radio transmission above 10 GHz, rain leads to significant attenuation of signals. For example, different amounts of rainfall may attenuate the signal from 10 dB/km to 30 dB/km. As a result, rainfall and other weather conditions may limit the distances between antennas.

Further, visibility may be impacted by pollution, fog, smoke, or the like making positioning an antenna using line-of-sight difficult. It is not uncommon that optical alignment accessories are used to correctly align antennas. In one example, a monocular may be coupled to an antenna to assist in antenna alignment and/or orientation. Alternatively, mirrors and lasers have been used to assist in alignment. Unfortunately, pollution or other obstructions that limit visibility (even if there is no impact on signal quality) may limit the effectiveness of optical alignment. Further, even if air conditions are clear and optical tools are utilized, the installer needs to know exact location of the remote site which can be very challenging in an urban environment.

SUMMARY OF EMBODIMENTS

An exemplary method comprises positioning a first antenna to receive a first signal from a second antenna, the second antenna comprising energy absorbing material that functions to expand beamwidth, receiving the first signal from the second antenna, detecting a plurality of gains based on the first signal, repositioning the first antenna relative to the second antenna to a position associated with an acceptable gain based on the first signal, removing at least some of the energy absorbing material from the second antenna to narrow the beamwidth of the second antenna, receiving, by the first antenna, a second signal from the second antenna, detecting a plurality of gains based on the second signal, and repositioning the first antenna relative to the second antenna to a position associated with an increased gain of the plurality of gains based on the second signal, the increased gain being greater than the acceptable gain.

In various embodiments, repositioning the first antenna relative to the second antenna to the position associated with the acceptable gain of the plurality of gains based on the first signal may comprise positioning the first antenna based on a maximum gain detected of the plurality of gains. Detecting the plurality of gains based on the first signal, each gain associated with the different position of the first antenna relative to the second antenna may comprise detecting the plurality of gains associated with different positions of the first antenna relative to the second antenna until detection of the acceptable gain, the acceptable gain being above a first predetermined threshold.

The method may further comprise measuring a voltage associated with the first signal to detect the plurality of gains associated with different positions of the first antenna relative to the second antenna. In some embodiments, the energy absorbing material narrows an aperture of the second antenna to broaden the beamwidth of the second antenna. The energy absorbing material may be adhered to the second antenna and removed from the second antenna by peeling the at least some of the energy absorbing material from the second antenna.

In various embodiments, repositioning the first antenna relative to the second antenna to the position associated with the increased gain of the plurality of gains based on the second signal, the increased gain being greater than the acceptable gain of the plurality of gains based on the first signal, may comprise repositioning the first antenna relative to the second antenna based on the maximum gain of the plurality of gains based on the second signal. Detecting the plurality of gains based on the second signal, each gain associated with the different position of the first antenna relative to the second antenna may comprise detecting the plurality of gains associated with different positions of the first antenna relative to the second antenna until detection of the increased gain, the increased gain being above a second predetermined threshold.

In some embodiments, the method may further comprise receiving, by the second antenna, a third signal from the first antenna, detecting a plurality of gains associated with different positions of the second antenna relative to the first antenna, and repositioning the second antenna relative to the first antenna to adjust a detected gain of the third signal. Further, the method may also comprise removing at least some of energy absorbing material from the first antenna to narrow a beamwidth of the first antenna, receiving, by the second antenna, a fourth signal from the first antenna, detecting a plurality of gains based on the fourth signal, each gain associated with a different position of the second antenna relative to the first antenna, and repositioning the second antenna relative to the first antenna to a position associated with an increased gain of the plurality of gains based on the fourth signal, the increased gain being greater than the acceptable gain of the plurality of gains based on the third signal.

An exemplary system comprises a first antenna and a meter. The first antenna may be configured to be positioned to receive a first signal from a second antenna, the first antenna comprising energy absorbing material, the energy absorbing material enabling expansion of a beamwidth of the first antenna, the first antenna configured to be repositioned relative to the second antenna based on an acceptable gain of the first signal, to be positioned to receive a second signal from the second antenna, at least some of the energy absorbing material being removed from the first antenna prior to reception of the second signal, the first antenna configured to be repositioned relative to the second antenna based on an increased gain of the second signal, the increased gain being greater than the acceptable gain of the plurality of gains based on the first signal. The meter coupled to the first antenna and configured to determine if a detected gain of the first signal is greater than or equal to the acceptable gain and to determine if a detected gain of the second signal is greater than or equal to the increased gain.

Another exemplary embodiments comprises positioning a first antenna to receive a first signal from a second antenna, the first antenna comprising energy absorbing material that functions to expand beamwidth of the first antenna, receiving, by the first antenna, the first signal from the second antenna, detecting a plurality of gains based on the first signal, each gain associated with a different position of the first antenna relative to the second antenna, repositioning the first antenna relative to the second antenna to a position associated with an acceptable gain of the plurality of gains based on the first signal, removing at least some of the energy absorbing material from the first antenna to narrow the beamwidth of the first antenna, receiving, by the first antenna, a second signal from the second antenna, detecting a plurality of gains based on the second signal, each gain associated with a different position of the first antenna relative to the second antenna, and repositioning the first antenna relative to the second antenna to a position associated with an increased gain of the plurality of gains based on the second signal, the increased gain being greater than the acceptable gain of the plurality of gains based on the first signal.

An exemplary system comprises a first antenna and a meter. The first antenna may be configured to be positioned to receive a first signal from a second antenna, the second antenna comprising energy absorbing material, the energy absorbing material enabling expansion of a beamwidth of the second antenna, the first antenna configured to be repositioned relative to the second antenna based on an acceptable gain of the first signal, to be positioned to receive a second signal from the second antenna, at least some of the energy absorbing material being removed from the second antenna prior to reception of the second signal, the first antenna configured to be repositioned relative to the second antenna based on an increased gain of the second signal, the increased gain being greater than the acceptable gain of the plurality of gains based on the first signal. The meter may be coupled to the first antenna and configured to determine if a detected gain of the first signal is greater than or equal to the acceptable gain and to determine if a detected gain of the second signal is greater than or equal to the increased gain.

Other features and aspects of various embodiments will become apparent from the following detailed description, taken in conjunction with the accompanying drawings, which illustrate, by way of example, the features of the various embodiments.

DETAILED DESCRIPTION OF VARIOUS EMBODIMENTS

Figure 1:
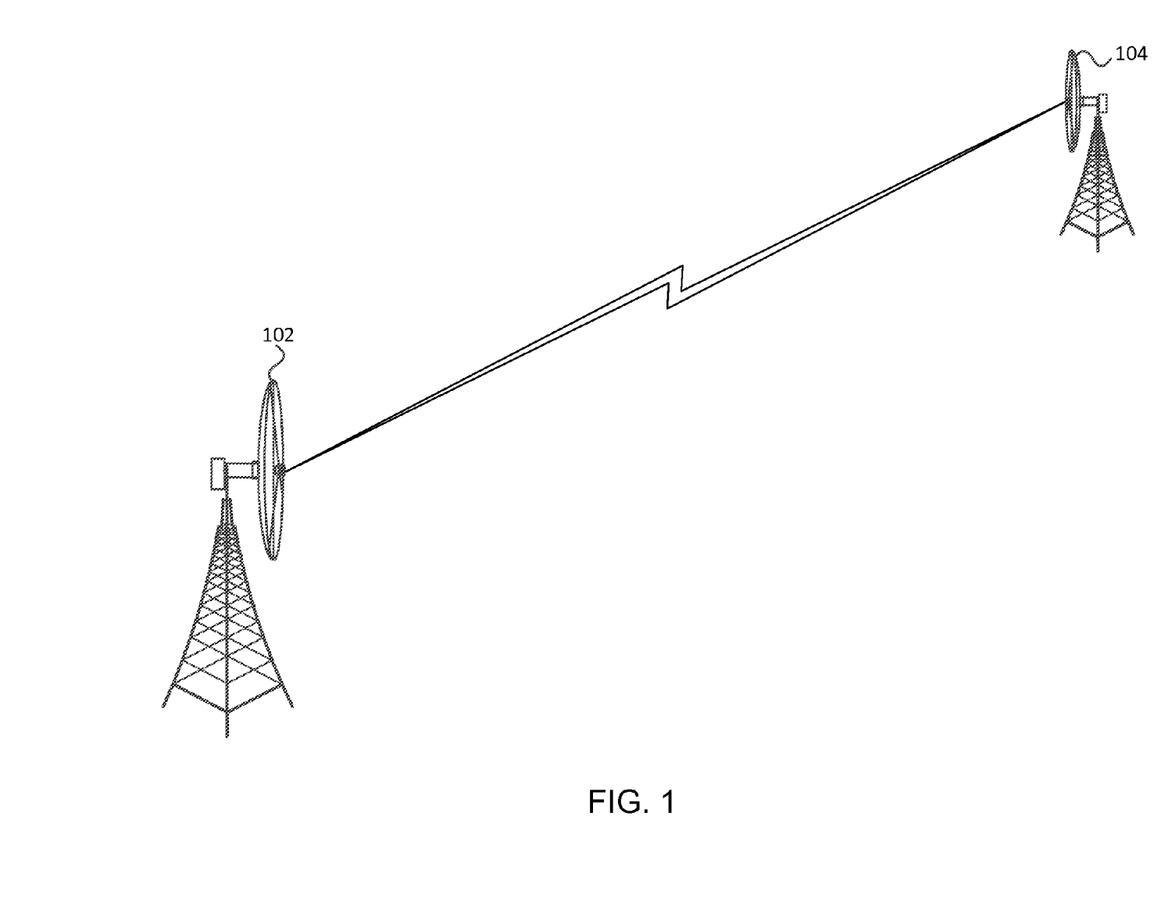
FIG. 1 depicts a local antenna in communication with a remote antenna in some embodiments.

FIG. 1 depicts a local antenna 102 in communication with a remote antenna 104 in some embodiments. The local antenna 102 and remote antenna 104 may be any type of antenna including, for example, a parabolic antenna (e.g., aperture antenna). A parabolic antenna is an antenna that uses a parabolic reflector to direct radio waves. An exemplary parabolic antenna may comprise a reflector element and a feed antenna. The reflector element may be made of many different types of material and may be any shape (e.g., circular dish, rectangular, or the like). The feed antenna is typically at the reflector's focus and is a low-gain type antenna. Those skilled in the art will appreciate that the local antenna 102 and the remote antenna 104 may be any kind of antennas.

Many antennas, especially those in the e-band, utilize point-to-point transmission systems to obtain necessary gain and/or other desired signal characteristics over significant distances. Directing a radiation pattern with a narrow beamwidth from a transmitting antenna (e.g., transmitting effectiveness) and/or a receiving antenna (e.g., receiving effectiveness) in a point-to-point wireless network allows for increased gain or other improved signal characteristics. Obtaining greater gain and/or other improved signal characteristics may increase reliability in poor weather conditions and may also allow for the receive and transmission antennas to be spaced further apart. Unfortunately, as the distance between the two antennas increase and the beamwidths of one or both radiation patterns of the antennas narrows, it becomes increasingly difficult to position each antenna such that each antenna detects a signal from the other. Even if a receiving antenna is generally positioned relative to the transmitting antenna, it remains difficult to adjust the orientation and position of the receiving antenna to reliably improve or maximize gain or other signal characteristics.

When a receiving antenna is a significant distance from a transmitting antenna and the transmitting antenna is transmitting a pencil beam radiation pattern, the two antennas are typically positioned to allow the pencil beam to be directed to the receiving antenna such that the receiving antenna may receive a signal from the transmitting antenna. Considerable time may be wasted as the antennas are adjusted until the receiving antenna is within the radiation pattern of the transmitting antenna. Typically, workers at the receiving antenna and workers at the transmitting antenna move the antenna elements (e.g., the "dish") such that a signal from the transmitting antenna may be received by the receiving antenna. If a signal is detected, then the receiving antenna may be further oriented or repositioned to maximize gain or other signal characteristics of the signal (e.g., adjusting position of the receiving element of the receive antenna). The transmitting antenna may also be oriented to improve gain at the receiving antenna.

In one example, millimeter wave point-to-point antennas may have a 3 dB beamwidth of 1.2 degrees (e.g., gain of 43 dBi for 30 cm dish antenna at 80 GHz—a typical type of antenna for E-band point-to-point applications). If the initial antenna orientation is within +1-6 degrees in azimuth and elevation of the correct direction, there may be 10 discrete orientation positions for each polarization (e.g., 100 direction spots in AZ-EL plane). In case the link fade margin is below antenna sidelobe levels (typical SLL are >30 dB), the time to align the antennas can be very high.

Much faster antenna orientation can be achieved by temporary widening the antenna beamwidth (e.g., with beamwidth of 3.6 degrees). In this example, the antenna orientation may be much faster while still feasible as the antenna gain may reduce less than the link fade margin (e.g., 2×9.5 dB).

Antenna alignment may involve adjusting the direction of each antenna until the received signal strength reaches a desired or maximum level at each end of the link. Fine adjustment for azimuth (horizontal angel) and elevation (vertical angel) may be built into each antenna mount. Adjustment procedures may be provided with each antenna.

If the horizontal adjuster does not provide sufficient range to locate the main beam, the antenna mounting brackets may need to be loosened and the antenna swiveled on its pole mount to locate the beam. Some mounts for larger antennas may have a separately clamped swivel base to allow the loosened antenna to swivel on it without fear of slipping down the pole. Where such a mount is not provided a temporary swivel clamp may be provided using a pair of pipe brackets bolted together immediately below the antenna mount.

Figure 2:
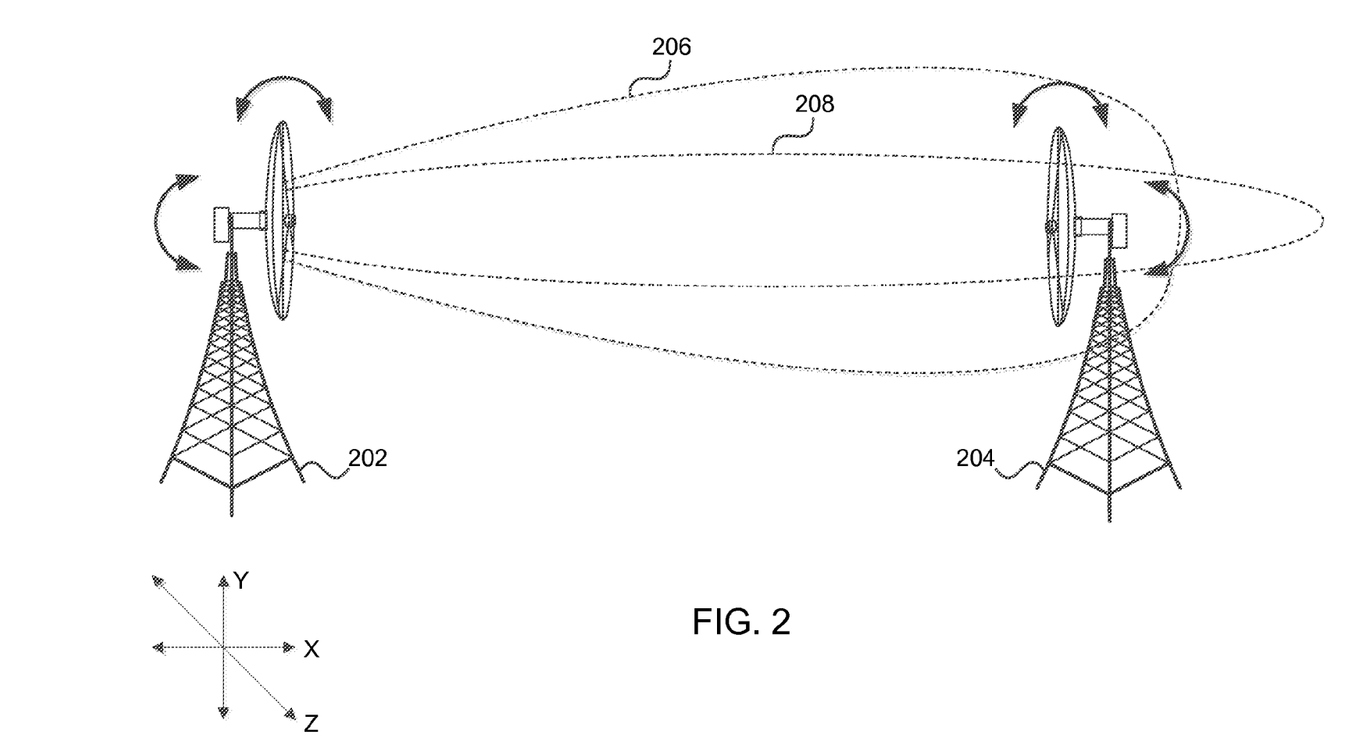
FIG. 2 is a diagram depicting a transmitting antenna and a receiving antenna in some embodiments.

FIG. 2 is a diagram depicting a transmitting antenna 202 and a receiving antenna 204 in some embodiments. In various embodiments, the transmitting radiation pattern 206 of the transmitting antenna 202 may be broadened (e.g., the beamwidth of the transmitting radiation pattern broadened) such that the receiving antenna 204 may more easily be positioned to detect a signal from the transmitting antenna. Once the signal from the transmitting antenna 202 is detected, the receiving antenna 304 may be further oriented or repositioned such that the receiving antenna 304 may maximize or receive a desired gain and/or other characteristic of the signal. Similarly, the transmitting antenna 202 may also be repositioned such that the receiving antenna 204 receives a signal with maximum gain or other characteristic.

Those skilled in the art will appreciate that the receiving antenna 204 may be more easily positioned and repositioned to find a signal from the transmitting antenna 202 when the transmitting radiation pattern 206 is broader. In one example, a signal may be more easily detected by generally directing the receiving antenna 204 towards the transmitting antenna 202. Once the signal from the transmitting antenna 202 is detected, minor adjustments to the orientation and/or position may be made to find a maximum gain or a gain above a predetermined threshold (e.g., above an acceptable gain). Those skilled in the art will appreciate that any signal characteristics, not just gain, may be used. For example, adjustments to the receiving antenna 204 may be performed to maximize desirable signal characteristics and/or minimize undesirable signal characteristics.

Subsequently, in order to achieve a final desired gain and/or other signal characteristics, the transmitting radiation pattern from the transmitting antenna 202 may be narrowed (e.g., a pencil beam is directed from the transmitting antenna 202 to the receiving antenna 204). Since the receiving antenna 204 is already oriented towards the transmitting antenna 202, the receiving antenna 204 may more easily find subsequent signals from the transmitting antenna 202. Once the subsequent signals from the transmitting antenna 202 is detected, the receiving antenna 202 may, again, be adjusted to maximize gain or gain above a second predetermined threshold (e.g., above an increased gain, the increased gain being greater than the acceptable gain). As discussed herein, adjustments to the receiving antenna 204 may be performed to maximize desirable signal characteristics and/or minimize undesirable signal characteristics of the subsequent signals.

Those skilled in the art will appreciate that the process may be iterative. For example, the process may continue as the radiation beam associated with the transmitting antenna is repeatedly narrowed after the receiving antenna detects a signal from the transmission antenna and the position adjusted to achieve the desired or expected characteristics. At each stage, the receiving antenna 204 and/or transmission antenna 202 may be repositioned to more easily direct the signal to the desired destination. Once a position is found (e.g., a position that maximizes gain or achieves a desired performance of a signal characteristic of a received signal), the beamwidth of the transmitting antenna, for example, may be subsequently narrowed. The receiving antenna, being already in a position that is proximate to the desired position as a result of the previous adjustment(s), may be repositioned to detect the signal at the desired gain or other signal characteristic.

In various embodiments, antenna alignment involves adjusting a direction (e.g., elevation, vertical, and/or horizontal position) for an antenna until the received signal strength reaches a maximum or desired level at each end of the link. Fine adjustment for azimuth (e.g., horizontal angle) and elevation (e.g., vertical angle) may be built into an antenna mount. In some embodiments, if the horizontal adjuster does not provide sufficient range to locate the main beam, antenna mounting brackets may be adjusted to locate the main beam.

In various embodiments, the beamwidth of an antenna may be altered by coupling the reflector element (or other element) of the antenna with energy absorbing materials. The energy absorbing material may be coupled to the antenna in any number of ways including, for example, adhesively or with a mechanical means (e.g., clips, staples, clamps, or the like). The functional effect of coupling the antenna to energy absorbing material may be to reduce the aperture of the antenna, thereby increasing the beamwidth of the associated radiation pattern. The energy absorbing materials are further discussed herein. Although some embodiments discussed herein include examples of expanding or broadening a radiation patter of a related antenna, those skilled in the art will appreciate that the radiation pattern may be broadened in any number of ways.

Gain, aperture, and beamwidth are related. For example, gain is a directive quality of an antenna and is a ratio of the power received by the antenna from a source along its beam axis to the power received by a hypothetical isotropic antenna. One equation regarding the gain of a parabolic antenna is as follows:

$$G = \frac{4\pi A}{\lambda^2} e_A = \frac{\pi^2 d^2}{\lambda^2} e_A$$

where:
A is the area of the antenna aperture, that is, the mouth of the parabolic reflector
d is the diameter of the parabolic reflector, if it is circular
$\lambda$ is the wavelength of the radio waves.
$e_A$ is a dimensionless parameter between 0 and 1 called the aperture efficiency. The aperture efficiency of typical parabolic antennas is 0.55 to 0.70.

As discussed herein, in aperture antennas, the larger the aperture (compared to the wavelength), the higher the gain. The gain increases with the square of the ratio of aperture width to wavelength.

The angular width of the beam radiated by an aperture antenna may be measured by half-power beamwidth (HPBW) which is the angular separation between points on the antenna radiation pattern at which the power drops to one-half (−3 dB) its maximum value. For parabolic antennas, the HPBW θ is given by:

$$\theta = k\lambda/d$$

where k is a factor which varies slightly depending on the shape of the reflector and the feed illumination pattern. For a "typical" parabolic antenna k=70 when θ is in degrees.

There is an inverse relation between gain and beamwidth. By combining the beamwidth equation with the gain equation, the relation is:

$$G = \left(\frac{\pi k}{\theta}\right)^2 \epsilon_A$$

The Friis equation gives the power received by one antenna under idealized conditions given another antenna a given distance away transmitting a known amount of power.

The inverse of the factor in parentheses is the so-called free-space path loss. To use the equation as written, the antenna gain may not be in units of decibels, and the wavelength and distance units must be the same. If the gain has units of dB, the equation is slightly modified to:

$$P_r = P_t + G_t + G_r + 20\log_{10}\left(\frac{\lambda}{4\pi R}\right)$$

(Gain has units of dB, and power has units of dBm or dBW) where $G_t$ and $G_r$ are the antenna gains (with respect to an isotropic radiator) of the transmitting and receiving antennas respectively, $\lambda$ is the wavelength, and R is the distance between the antennas. This form of the Friis equation applies under the following ideal conditions:
R≥≥λ (reads as R much greater than λ).
The antennas are in unobstructed free space.
$P_r$ is understood to be the available power at the receive antenna terminals.
$P_t$ is understood to be the power delivered to the transmit antenna.
The antennas are correctly aligned and polarized.
The bandwidth is narrow enough that a single value for the wavelength can be assumed.

To detect a desired gain or other signal characteristic, in some embodiments, a Received Signal Level (RSL) is monitored and the alignment of the receiving antenna is adjusted to maximize RSL. The RSL may be monitored at several alignment orientations of the receiving antenna. The receiving antenna may be oriented to a position associated with a maximum monitored RSL or a RSL that is above an expected threshold. The transmission beamwidth of the transmitting antenna may be narrowed and the process repeated (e.g., adjusting a position of or repositioning the receiving antenna to detect a signal, monitoring RSL at several alignment orientations of the receiving antenna, and orienting the receiving antenna to a position associated with a maximum RSL or a RSL that is above another expected threshold). The process may be repeated until the desired beamwidth of the transmission system, gain of the received signal, and/or other characteristic(s) of the received signal are obtained. In some embodiments, this process may be repeated at the far end of the link (e.g., the transmitting antenna may be adjusted and/or oriented to maximize gain or other characteristic(s) of a signal from the previously receiving antenna).

In one example of locating the main beam of an antenna, once a measurable signal is observed, very small alignment adjustments may be required to locate the main beam. For example, a 1.2 m antenna at 23 GHz typically has 0.9° of adjustment from center of main beam to the first null (0.4° to the −3 dB point). Antenna movement across the main beam will result in a rapid rise and fall of signal level. As a guide, 1 degree of beam width may be equivalent to moving approximately 1.0 mm around a standard 114 mm (4.5 in.) diameter O/D pipe. Antennas may be verified as being on main beam (as opposed to a side lobe) by comparing measured receive signal level with the calculated level. Signal strength readings are usually measurable when at least a main beam at one end and first side lobes at the other are aligned. The strongest signal occurs at the center of the main beam. The highest first lobe signal is typically 20-25 dB less than the main beam signal. When both antennas are aligned for maximum main beam signal strength, the receive signal level (RSL) should be within 2 dB of the calculated level for the path.

RSL, RSSI, or any characteristic or combination of characteristics of the signal may be monitored to adjust the orientation of the receiving antenna. In one example, a voltmeter, such as a multimeter, may be used to measure the RSSI voltage at an outdoor unit (e.g., the ODU of FIG. 4) coupled to the antenna. In one example, antenna alignment may be adjusted until the voltmeter indicates a minimum or sufficiently low value. In one example, a plurality of detected RSSI voltages are detected as the receiving antenna is aligned and realigned. The lowest detected RSSI voltage of the plurality of voltages may be selected and the receiving antenna may be aligned with a position associated with the lowest detected RSSI voltage. In another example, a measured RSSI voltage at the ODU may be compared to a predetermined threshold. The receiving antenna may be aligned until the RSSI voltage is at or below the predetermined threshold. In yet another example, the antenna may be realigned until the detected RSSI voltage is within a range (e.g., statistically close) to a desired RSSI voltage.

Those skilled in the art will appreciate that the antenna may be realigned based on the detected RSSI voltage in many ways. In various embodiments, the RSSI voltage provides a direct relationship with RSL. For example, an RSSI of 0.25 Vdc=−10 dBm decrease in RSL. (See table RSL—voltage at BNC—so for a voltage at BNC (Vdc), there is a commiserate RSL (dBm).

This procedure could be improved by providing a locking mechanism on the mounting mechanics. For example, after finding the correct position of the receiving antenna 204 with the most wide radiation beamwidth, the mechanical mechanism used for rotating the receiving antenna 204 may be locked for the next diaphragm beamwidth so that antenna could not be mechanically oriented outside spatial region dictated by the current diaphragm beamwidth.

In case link hop length is very long (moderate link fade margin) the receiver sensitivity may be increased by the use of single tone (CW) transmitted signal rather than a wideband modulated signal used only during antenna alignment procedure. As much as 20 dB receiver sensitivity could be gained using this approach (200 MHz modulated signal for typical E band application using the narrowest channel versus 2 MHz receiver resolution bandwidth for CW reception).

Although the discussion regarding FIG. 2 contemplates changing the radiation pattern (e.g., a transmission radiation pattern) of the transmitting antenna 202, those skilled in the art will appreciate that instead of changing the radiation pattern of the transmitting antenna 202, the radiation pattern (e.g., a receptivity radiation pattern) of the receiving antenna 202 may be changed. For example, the radiation pattern of the receiving antenna 202 may be initially broadened (e.g., by coupling the receiving element of the receiving antenna 202 with energy absorbing material to narrow the aperture). After the receiving antenna 202 detects the signal from the transmitting antenna 202, the receiving antenna 202 may be adjusted to achieve an acceptable gain and/or other signal characteristic. Subsequently, some if not all of the energy absorbing material may be removed and the receiving antenna 202 may be positioned to detect a subsequent signal from the transmitting antenna 202. After detection of the subsequent signal, the receiving antenna 204 may be repositioned to achieve another desired acceptable gain and/or other signal characteristic. This process may be repeated until the final gain (e.g., an increased gain) or other signal characteristic is attained.

Those skilled in the art will appreciate that the radiation pattern of both the transmitting antenna 202 and the receiving antenna 204 may be broadened and subsequently narrowed. In some embodiments, the radiation pattern of both the transmitting antenna 202 and the receiving antenna 204 may be narrowed simultaneously or near simultaneously (e.g., by removing at least some energy absorbing material from both antennas). In various embodiments, some energy absorbing material may be removed from one antenna and, after repositioning, some energy absorbing material may be removed from the other antenna. Those skilled in the art will appreciate that the radiation pattern in both antennas may be broadened and narrowed in any way at any time.

Figure 3A:
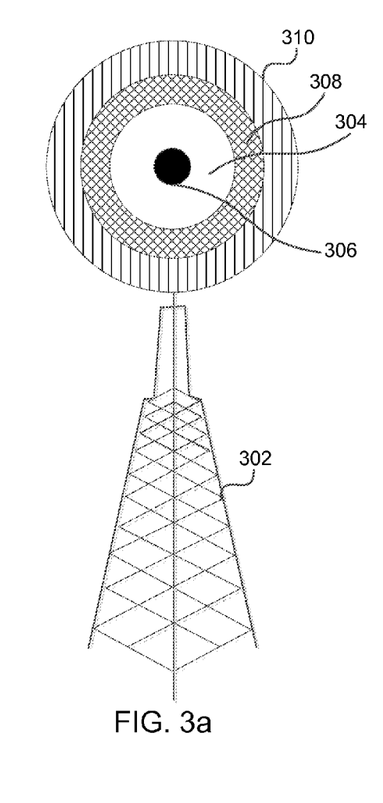
FIGS. 3a-c depict antennas which may be coupled to varying amounts of energy absorbing material to decrease aperture of the antennas in some embodiments.
Figure 3B:
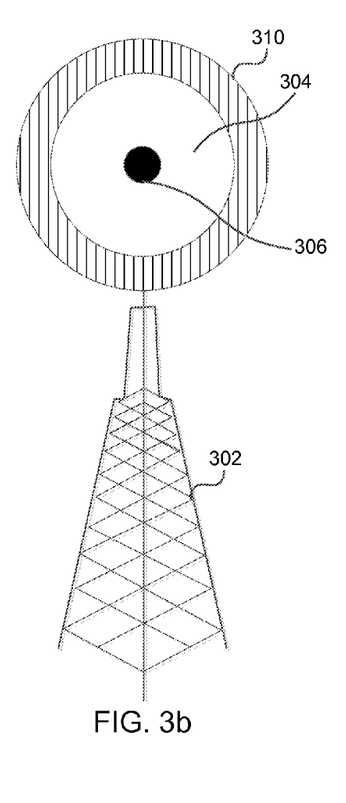
Figure 3C:
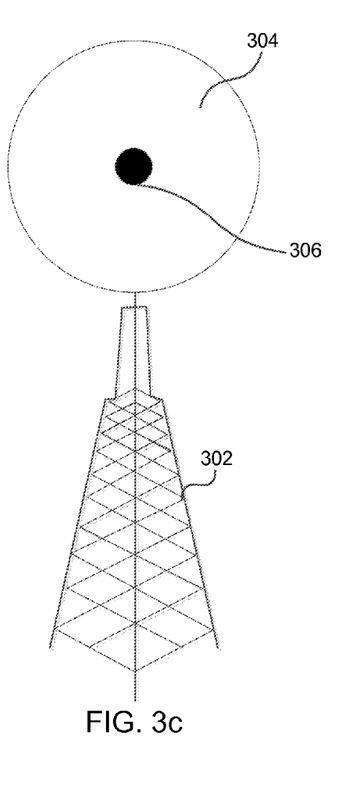

FIGS. 3a-c depict antennas 302 which may be coupled to varying amounts of energy absorbing material to decrease aperture of the antennas 302 in some embodiments. In various embodiments, diaphragms of different openings made of appropriate absorbing material to control the antenna radiation beamwidth during the link setup may be used to assist in the process of finding signals from remote antennas and adjusting a local antenna position to increase gain of received signals. For example, three different diaphragms could be used with 3 dB beamwidths of 12, 6, and 3 degrees, respectively. Those skilled in the art will appreciate that any number of diaphragms may be used which may be stripped off the antenna to change a radiation pattern.

Diaphragms may be made of a thin sheet absorbing material and attached to the antenna rim. In some embodiments, after finding a maximum signal level for the most wide beamwidth (diaphragm with narrowest opening), this diaphragm may be removed and the next diaphragm would allow for a wider aperture when compared to the antenna without the diaphragm but still a more narrow aperture when compared to the previous aperture of the antenna (i.e., before any of the diaphragm was removed).

In one example, the energy absorbent material may be a thin, flexible flat sheet configured to adhere to a part of the antenna (e.g., across all or apportion of the aperture of an aperture antenna). The energy absorbent material may include one or more dielectric loaded silicone rubber sheets. The energy absorbent material may be any dimension or thickness. Those skilled in the art will appreciate that any energy absorbing material may be used. For example, Eccosorb DSF free space resonant absorbers from Emerson & Cuming Microwave Products™, Q-Zorb RFSB single band absorber from Laird Technologies™, Q-Zorb RFSW surface wave absorber from Laird Technologies™, or the like may be used. Any adherent maybe used including RTV silicone based adhesives with or without a primer, or the like. In some embodiments, the energy absorbent material may be coupled to the antenna through the use of mechanical fasteners or the like.

In various embodiments, the antenna 302 is directed to a remote antenna. The energy absorbent material 308 and 310 function to broaden the beamwidth of the antenna 302 thereby allowing the remote antenna to more easily find a signal from the remote antenna and be oriented to thereby increase the gain (e.g., RSL) associated with the signal. After the remote antenna is positioned and adjusted to receive the desired and/or maximum gain of the signal, energy absorbent material 308 may be removed (e.g., peeled off of the antenna by a worker) thereby increasing the functional aperture of the antenna 302 and decreasing the beamwidth. Alternately, the energy absorbent material 308 and 310 function to broaden the beamwidth to allow the antenna 302 to allow the remote antenna t more easily find a signal from the antenna 302.

In various embodiments, the energy absorbent material 308 is the same material as the energy absorbent material 310. In other embodiments, the energy absorbent material 308 is not the same material as the energy absorbent material 310.

FIG. 3a depicts an antenna 302 with energy absorbent material 308 and 310 covering a portion of the antenna 302 in some embodiments. Antenna 302 comprises a parabolic reflector 304 and a feed antenna 306. The parabolic reflector 304 is blocked, at least partially, by the energy absorbent material 308 and 310. The energy absorbent material 308 and 310 functionally shrinks the aperture of the antenna 302 and thereby broadens the transmission/reception radiation pattern of the antenna 302 (e.g., broadens the half-power beamwidth (HPBW)).

FIG. 3b depicts an energy absorbent material 310 covering a portion of the antenna 302 in some embodiments. Since the energy absorbent material 310 covers a smaller portion of the parabolic reflector 304, the functional aperture of the antenna 302 is greater than that discussed with regard to FIG. 3a. The resulting transmission/reception radiation of the antenna 302 is broader than an antenna with similar characteristics as antenna 302 but without the energy absorbent material 310. Further, the resulting transmission/reception radiation of the antenna 302 is smaller than the resulting transmission/reception radiation of the antenna 302 as depicted in FIG. 3a.

As discussed herein, once the remote antenna has been oriented to a desired and/or maximum gain based on the smaller functional aperture of the antenna 302 associated with FIG. 3a, energy absorbent material 308 may be removed from the antenna 302 thereby increasing the functional aperture of the antenna 302 and decreasing the beamwidth. The energy absorbent material 310 continues to function to broaden the beamwidth of the antenna 302 (when compared to an antenna with less or without any energy absorbent material) thereby allowing the remote antenna to more easily find a signal from the antenna 302 and be oriented to thereby increase the gain (e.g., RSL) associated with the signal. After the remote antenna is positioned and repositioned to receive the desired and/or maximum gain of the signal, energy absorbent material 310 may be removed (e.g., peeled off of the antenna by a worker) thereby further increasing the functional aperture of the antenna 302 and further decreasing the beamwidth.

FIG. 3c depicts the antenna 302 without the energy absorbent material in some embodiments. The parabolic reflector 304 may provide the narrowest beamwidth of transmission/radiation patterns in comparison with the antennas of FIGS. 3a and 3b. In a manner similarly discussed regarding FIGS. 3a and 3b, the remote antenna may be again repositioned to find the signal from the antenna 302 and then be adjusted to receive the desired and/or maximum gain of the signal.

Although the discussion regarding FIGS. 3a-3c contemplate removal of two separate portions of energy absorbent material 308 and 310, those skilled in the art will appreciate that any number of portions of energy absorbent material may be used. For example, there may be three or more different portions of energy absorbent material which may be used to enlarge the transmission radiation pattern. After the receiving antenna is positioned, a portion of the energy absorbent material may be removed from the antenna 302 and the process may continue.

Although FIGS. 3a-c depict the removal of all energy absorbent materials from the antenna 402, any amount of energy absorbent materials may remain coupled to the antenna 302 at any time. For example, if a final desired gain or other characteristic of a signal is obtained, the energy absorbent materials may be left coupled to the antenna 302.

Although the discussion regarding FIGS. 3a-c energy absorbent materials coupled to a transmitting antenna 302, those skilled in the art will appreciate that the energy absorbent material may be coupled to a receiving antenna. As a result, the reception radiation pattern may be broadened to more easily find signals from the transmitting antenna. The iterative process of finding a signal from the transmitting antenna, adjusting the position of the receiving antenna for improved gain, removing some of the energy absorbent material from the receiving antenna may continue in a manner similar to that described herein.

Figure 4:
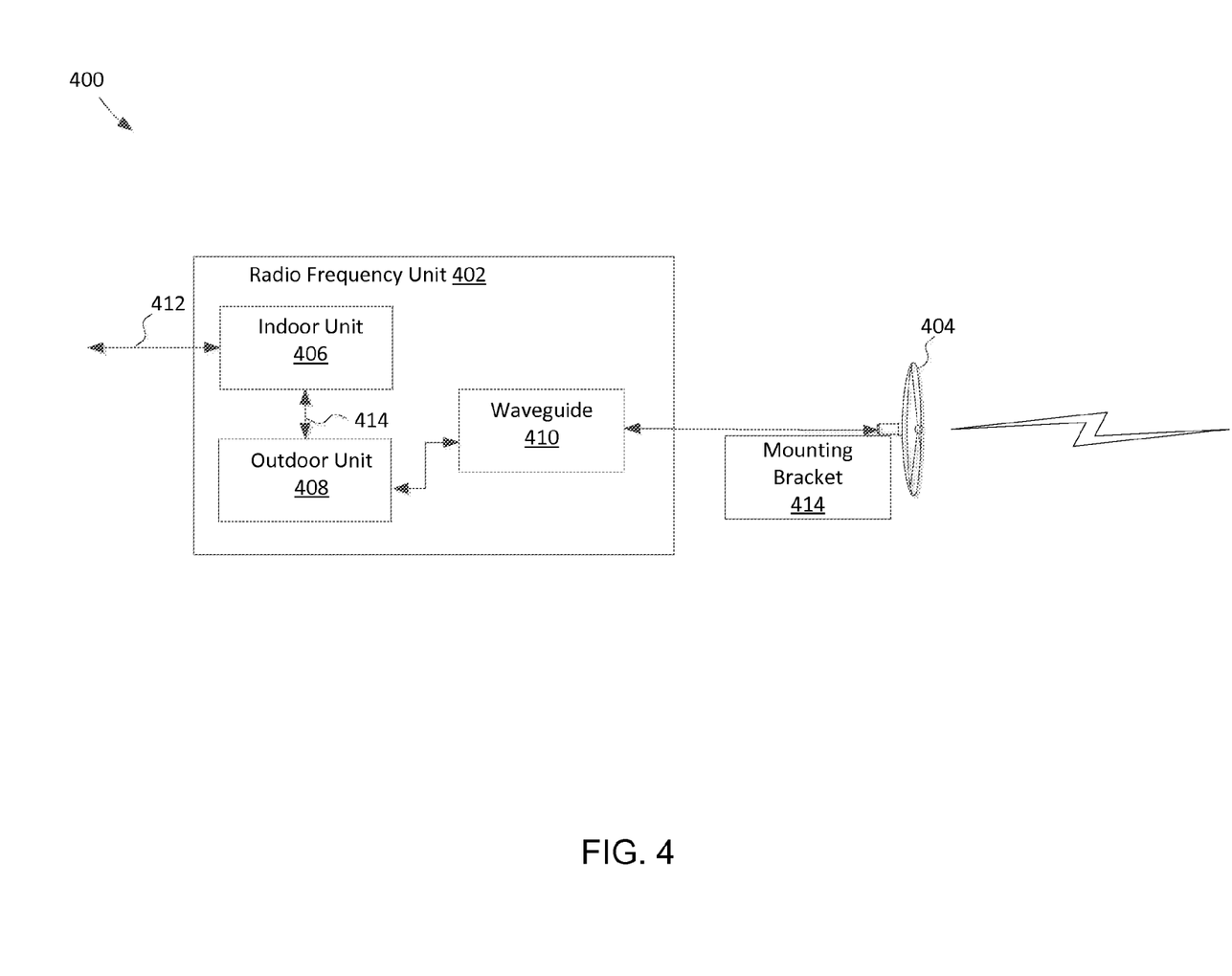
FIG. 4 is an environment including a transceiver unit in some embodiments.

FIG. 4 is an environment 400 including a transceiver unit 402 in some embodiments. The frequency radio unit 402 is a split mount radio. A split-mount radio has a part of the electronics mounted outdoors with an antenna and part indoors. The outdoor unit (ODU) may be the RF transmitter/receiver. The indoor unit (IDU) contains the modulator/demodulator, multiplexer, control, and traffic interface elements. The IDU and ODU may be coupled using a cable. By comparison, an all-indoor radio has all radio equipment installed inside and is connected to its antenna using a waveguide or coax feeder. A split-mount radio may be a point-to-point radio installation for licensed 6 to 38+ GHz frequency bands with the ODU direct-mounted to the rear of the antenna to provide an integral antenna feed. By having the ODU mounted with the antenna, split-mount may eliminate or reduce feeder losses, minimize or reduce rack occupancy, and/or lower installed costs compared to indoor radios.

For example, frequency radio unit 402 may comprise an indoor unit (IDU) 406 in communication with a processor and/or a digital device, an outdoor unit (ODU) 408 in communication with the IDU 406 over cables 414, a waveguide 410 in communication with the ODU 408, and an antenna 404. The IDU 406 may comprise a modulator/demodulator and control circuitry for providing data from a digital device or a processor over line 412 to the antenna 404 via the ODU 408 and/or the waveguide 410. Similarly, the IDU 406 may also be configured to receive information from the antenna 404 via the ODU 408 for providing to the digital device or processor via the line 412. The ODU 408 may comprise an RF transmitter/receiver and be coupled with the antenna 404. The waveguide 410 may or may not be a part of the ODU 408.

The IDU 406 of the transceiver unit 402 may be coupled to the ODU 408 utilizing a coaxial cable 414. Although only one coaxial cable 414 is depicted in FIG. 4, any number of coaxial cables may provide signals between the IDU 406 and the ODU 408. Further, those skilled in the art will appreciate that any number and/or type of cables may be configured to receive and transmit signals between the IDU 406 and the ODU 408.

In various embodiments, the gain and/or other signal qualities may be detected and/or measured with the use of a voltmeter. The voltmeter may be coupled to a part of the ODU 408 or the IDU 406.

In various embodiments, the antenna 404 may be mounted utilizing a mounting bracket 414. The mounting bracket 414 may allow the antenna 404 to move and/or be repositioned in any number of directions. In various embodiments, the mounting bracket 414 allows the antenna 404 to be repositioned vertically and horizontally.

The mounting bracket 414 may comprise adjustable locks that limit movement of the antenna 404. In one example, once the voltmeter at the ODU 408 determines that a signal is detected, a worker or a computer program may limit the movement of the antenna 404. In this example, after the radiation pattern of the antenna 404 or a remote antenna is narrowed and the antenna 404 is repositioned, the antenna 404 may not be moved in at least one direction that is away from the narrowed signal. By limiting the movements of the antenna 404 during alignment, the range of motion to readjust the antenna 404 may be repeatedly narrowed to allow for quicker detection of a subsequent signal within a narrowing beamwidth to achieve the desired gain or other signal characteristic.

Although the radio frequency unit 402 is depicted in FIG. 4 as a split mount device, the radio frequency unit may not be a split mount device.

Figure 5:
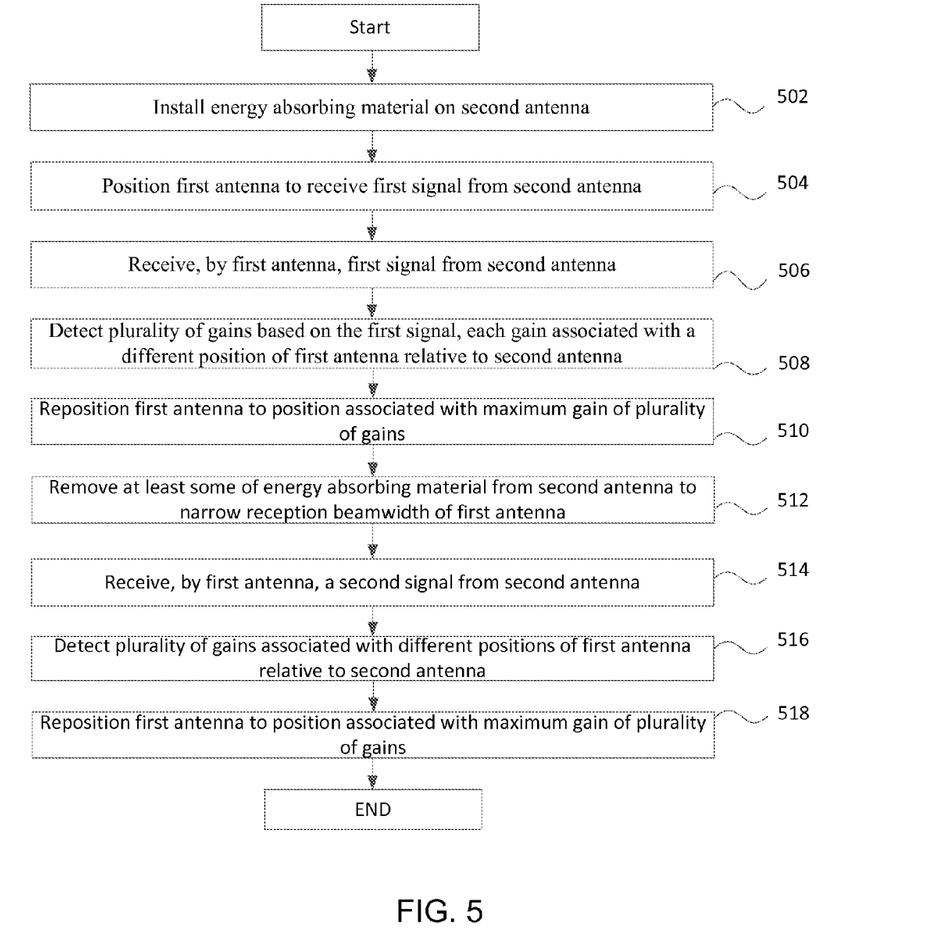
FIG. 5 is a flowchart for positioning a local antenna to find a signal from a remote antenna and achieve a desired gain and/or other signal characteristics in some embodiments.

FIG. 5 is a flowchart for positioning a local antenna to find a signal from a remote antenna and achieve a desired gain and/or other signal characteristics in some embodiments. In step 502, energy absorbing material is installed on the remote second antenna. In one example, the energy absorbing material may be adhered or coupled to a receiving element of the remote second antenna. In some embodiments, workers may adhere the energy absorbing material to the receiving element of the remote second antenna to broaden a transmission radiation pattern of the remote second antenna. The first antenna may more easily detect a signal within the broader transmission radiation pattern.

In some embodiments, the energy absorbing material may be adhered or coupled to a receiving element of the local first antenna. In some embodiments, workers may adhere the energy absorbing material to the receiving element of the local first antenna to broaden a reception radiation pattern of the local first antenna. The first antenna may more easily detect a signal within the broader reception radiation pattern. Those skilled in the art will appreciate that, in some embodiments, some energy absorbing material may be added to both of the antennas.

In step 504, the first antenna is positioned to receive a first signal from the second antenna. In various embodiments, the first antenna (e.g., the receive element of the first antenna) may be generally directed to the second antenna (e.g., the receive element of the second antenna). The first antenna may be positioned to search for a transmitted signal from the transmitting antenna. In some embodiments, workers utilize a voltmeter at the first antenna to detect the signal from the second antenna.

In step 506, the first antenna receives the first signal from the second antenna. In various embodiments, a signal from the second antenna may be detected at the first antenna. In some embodiments, a position of the antenna may be marked and/or correlated with the strength of the signal (e.g., level of gain of the signal detected or level of another signal characteristic). The position of the antenna may represent a first position threshold.

In step 508, a plurality of gains associated with different positions by the first antenna relative to the second antenna are detected. In one example, the voltmeter may be used to detect different gains associated with different positions of the first antenna. In step 510, the antenna may be repositioned to a position associated with the most desired detected signal propert(ies) (e.g., maximum gain). In various embodiments, the position of the antenna may be marked and/or correlated with the strength of the signal. The position of the antenna may represent a second position threshold.

Those skilled in the art will appreciate that as the radiation pattern of either the second antenna or first antenna narrows, the first antenna's position may be constrained by the first and/or second thresholds. As a result, the first antenna is less likely to be adjusted in a position that moves away from the main beam of the second antenna. For example, the thresholds may represent, in part, concentric circles in which the position of the first antenna may only be positioned within the narrowest concentric circle. Those skilled in the art will appreciate that the position of the first antenna may be limited by physical locks on a mounting bracket, physical limitations in the collar of the first antenna, thresholds, or any device or software.

In step 510, the first antenna is repositioned to a position associated with maximum gain of the plurality of gains. As described herein, the first position may be repositioned to a position associated with one or more desired signal characteristic(s) and/or avoidance of one or more undesired signal characteristic(s).

In step 512, at least some of the energy absorbing material may be removed from the second antenna to narrow transmission beamwidth of the second antenna. Any amount of the energy absorbing material may be removed. Those skilled in the art will appreciate that the beamwidth of the second antenna may be narrowed in any number of ways. In various embodiments, the aperture of the second antenna may be mechanically narrowed (e.g., utilizing a shutter or other device). Further, obstructions may be utilized to limit the aperture and/or narrow the beamwidth. In some embodiments, energy absorbing material may be removed from the first antenna to narrow a reception beamwidth of the first antenna.

In step 514, the first antenna receives a second signal from a second antenna. When the beamwidth of the second antenna is narrowed, the first antenna may no longer be positioned to receive the second signal from the second antenna. In various embodiments, the first antenna may be positioned based in part on the last position associated with desired signal characteristics of the previously received signal from the second antenna. Once the second signal is detected, a plurality of gains (or other signal characteristic(s)) may be detected. The plurality of gains or other signal characteristics may be associated with different positions of the first antenna in step 516.

In step 518, the first antenna is repositioned to a position associated with the most desired (e.g., maximum) gain or other signal characteristic. The first antenna may be repositioned based on the most desirable detected signal characteristic and the previous position.

In various embodiments, this process may be iterated until a desired strength of a signal characteristic is attained. For example, there may be a minimum gain required by the two antennas over a given distance. Once a signal is detected by a first antenna at or above the minimum gain, the process may end. The process of repositioning the first antenna and/or narrowing a transmission or reception radiation pattern may repeat until the desired gain (or other signal characteristic is achieved.

Figure 6:
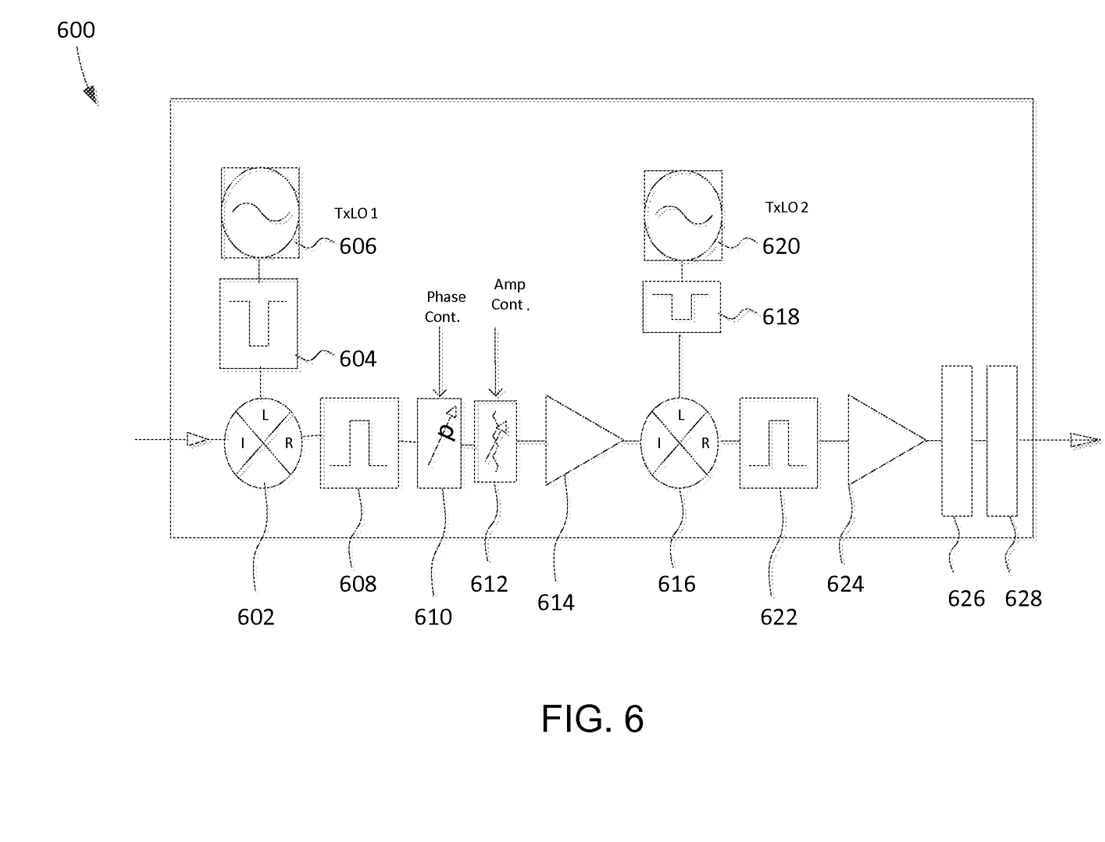
FIG. 6 depicts a radio frequency unit in some embodiments.

FIG. 6 depicts a radio frequency unit 202 in some embodiments. The radio frequency unit 202 may comprise mixer modules 602 and 616, filter modules 604, 608, 618, and 622, oscillator modules 606 and 620, a phase adjuster 610, an automatic gain control (AGC) module 612, amplification/attenuation modules 614 and 624, waveguide filter 626, and waveguide 628. The transmitting radio frequency unit 602 may further comprise a signal quality module that may control the phase adjuster 610 and/or the AGC module 612.

In various embodiments, the radio frequency unit 202 is a part of the ODU 408. The mixer module 602, filter module 604, and the oscillator module 606 may represent an upconverter configured to upconvert the signal received from a gain module to an intermediate frequency signal. Similarly, the mixer module 616, filter module 618, and oscillator module 620 also may represent an upconverter configured to further upconvert the signal to an RF signal. Those skilled in the art will appreciate that there may be any number of upconverters configured to upconvert the signals within the transmitting radio frequency unit 602.

The mixer modules 602 and 616 may comprise mixers configured to mix the signal(s) provided by the modem with one or more other signals. The mixer modules 602 and 616 may comprise many different types of mixers with many different electrical properties. In one example, the mixer 602 mixes the signal received from a gain module (not shown) with the filtered oscillating signal from the filter module 604 and the oscillator module 606. In another example, the mixer module 616 mixes a signal received from the amplifier/attenuator module 614 with the filtered oscillating signal from the filter module 618 and the oscillator module 620.

Those skilled in the art will appreciate that each of the mixers 602 and 616 may be the same as one or more other mixer modules. For example, mixer modules 602 and 616 may both be mixers sharing the same electrical properties or, alternately, the mixer 602 and 616 may be another kind of mixer and/or with different electrical properties. Each mixer modules 602 and 616 may include one or more components. For example, the mixer module 602 may comprise one or more mixers.

The filter modules 604, 608, 618, and 622 may comprise filters configured to filter the signal. The filter modules 604, 608, 618, and 622 may comprise many different types of filters (e.g., bandpass filter, low pass filter, high pass filter, or the like) with many different electrical properties. In one example, the filter module 604 may be a band pass filter configured to filter the oscillation signal (or components of the signal) provided from the oscillator module 606. Similarly, filter modules 604, 608, 618, and 622 may filter signals (or components of the signals) from the oscillator module 606, the oscillator module 620, the mixer module 602, or the mixer module 616, respectively.

Those skilled in the art will appreciate that each of the filter modules 604, 608, 618, and 622 may be the same as one or more other filter modules. For example, filters modules 604 and 608 may both be filters sharing the same electrical properties while filter module 618 may be another kind of filter. In another example, filters module 604 and 608 may both be filters of a similar type but have different electrical properties.

Each filter modules 604, 608, 618, and 622 may include one or more components. For example, the filter modules 604 may comprise one or more filters.

The oscillator modules 606 and 620 may comprise oscillators configured to provide an oscillating signal that may be used to upconvert the signal. The oscillator modules 606 and 620 may comprise any kind of oscillator with any different electrical properties. In one example, the oscillator module 606 provides an oscillating signal to the filter module 604. The oscillator module 620 may provide an oscillating signal to the filter module 618.

The oscillator modules 606 and 620, either individually or together, may be local or remote. In one example, the oscillating module 606 and/or the oscillating module 620 may be remotely located and configured to provide an oscillating signal to one or more transmitting radio frequency units. In some embodiments, a single oscillating module may provide an oscillating signal to both the mixer module 602 and 616, respectively (e.g., optionally via a filter). In one example, the oscillator signal from the oscillator module may be altered (e.g., oscillation increased or decreased) and provided to a different part of the circuit.

Those skilled in the art will appreciate that each of the oscillator modules 606 and 620 may be the same as each other. For example, oscillator modules 606 and 620 may both be oscillators sharing the same electrical properties or, alternately, the oscillator modules 606 and 620 may be another kind of oscillator and/or with different electrical properties. Each oscillator modules 606 and 620 may include one or more components. For example, the oscillator module 606 may comprise one or more oscillators.

In various embodiments, the radio frequency unit 202 includes a signal quality module. The signal quality module may be configured to generate a phase control signal to control the phase of a processed signal. In one example, the signal quality module receives the upconverted RF signal from the amplifier/attenuator module 624 and mixes the amplified or attenuated signal with the filtered oscillator signal or the upconverted signal from the second upconverter. The signal quality module may filter the signal and compare the filtered, mixed signal with a predetermined phase value to generate a phase control signal based on the comparison.

The phase adjuster 610 may comprise a variable phase control circuit configured to increase or decrease the phase of the signal to be transmitted. The phase adjuster 610 may comprise any different type of phase adjuster or phase shifter with different electrical properties. In one example, the phase adjuster 610 increases or decreases the phase of the signal received from the filter module 608. The phase adjuster 610 may adjust the phase of the signal based on the phase control signal from the signal quality module.

The phase adjuster 610 may include one or more components. For example, the phase adjuster 610 may comprise one or more phase control elements.

The AGC module 612 may comprise an automatic gain control (AGC) circuit configured to increase or decrease the gain of the signal received from the phase adjuster 610. The AGC module 612 may comprise many different types of AGCs with many different electrical properties. In one example, the AGC module 612 increases or decreases the gain of the signal received from the phase adjuster 610. The AGC module 612 may adjust the gain of the signal based on the gain control signal.

The AGC module 612 may include one or more components. For example, the AGC module 612 may comprise one or more AGCs.

In various embodiments, in order to adjust the phase of the signal or the amplitude of the signal, the signal quality module may provide control signals to adjust the filtered signal from the filter module 608 to achieve the desired adjustment. For example, in order to adjust the phase or amplitude of the signal, the signal quality module may compare the phase and amplitude of the signal to be provided to the waveguide filter 626 and/or the waveguide 628 based on a predetermined phase value and/or a predetermined amplitude value. Based on the comparison, the signal quality module may generate phase and gain control signals to achieve the desired adjustment.

In some embodiments, the predetermined phase value and amplitude value may be the same or substantially similar as the phase and amplitude of the wireless signals outputted by one or more other transmitting radio frequency units. In one example, the phase and the amplitude of one or more transmitting radio frequency unit may be synchronized.

The amplification/attenuation modules 614 and 624 may comprise an amplifier and/or an attenuator configured to amplify and/or attenuate a signal. The amplification/attenuator modules 614 and 624 may be any kind of amplifiers and/or attenuators. Further, the amplification/attenuator modules 614 and 624 may each comprise amplifiers and/or attenuators with any kind of electrical properties.

In some embodiments, the amplifier/attenuator module 614 receives a signal from the AGC module 612. The amplifier/attenuator module 614 may amplify or attenuate the signal. Further, the amplifier/attenuator module 624 may attenuate the signal (or components of the signal) after the signal has been upconverted by the mixer module 616, the filter module 618, and the oscillator module 620. The amplifier/attenuator module 624 may then provide the signal to the signal quality module and/or the waveguide filter 626.

Those skilled in the art will appreciate that each of the amplifier/attenuator modules 614 and 624 may be the same as one or more other amplifier/attenuator modules. For example, amplifier/attenuator modules 614 and 624 may both be amplifiers sharing the same electrical properties. In another example, amplifier/attenuator modules 614 and 624 may both be amplifiers but have different electrical properties.

The radio frequency unit 202 may comprise the waveguide filter 626 and the waveguide 628. The waveguide filter 626 may be any filter coupled to the waveguide 628 and configured to filter the electromagnetic waves (e.g., remove noise). The waveguide 628 may provide the signal to an antenna via a diplexer. The diplexer may provide the signal to the antenna. The waveguide 628 may be any waveguide kind or type of waveguide. For example, the waveguide 628 may be hollow or dielectric. In some embodiments, the waveguide 628 comprises a rectangular to circular waveguide.

In various embodiments, the signal detection and/or detection of signal characteristics may occur at any point. In some embodiments, a voltmeter detects a signal received by an antenna by measuring voltage at the IF frequency.

Figure 7:
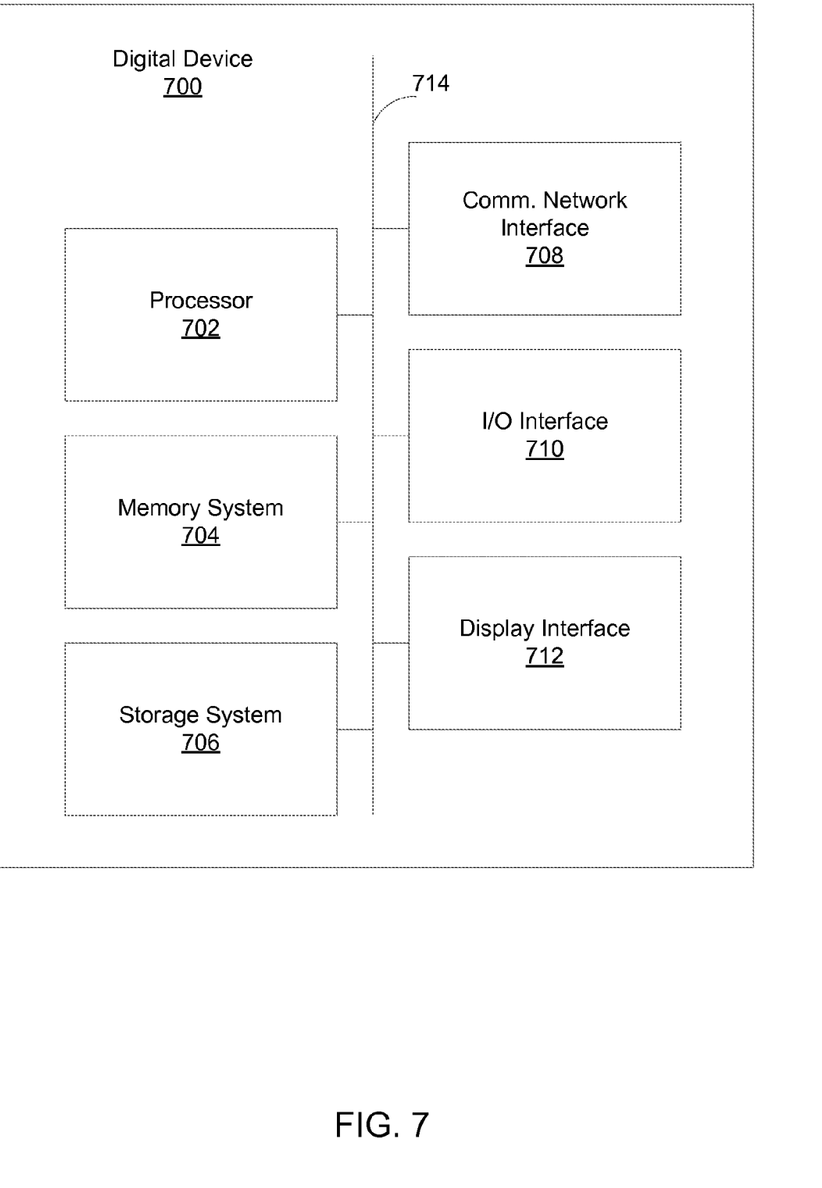
FIG. 7 depicts an exemplary digital device according to some embodiments.

FIG. 7 depicts an exemplary digital device 700 according to some embodiments. The digital device 700 comprises a processor 702, a memory system 704, a storage system 706, a communication network interface 708, an I/O interface 710, and a display interface 712 communicatively coupled to a bus 714. The processor 702 may be configured to execute executable instructions (e.g., programs). In some embodiments, the processor 702 comprises circuitry or any processor capable of processing the executable instructions.

The memory system 704 is any memory configured to store data. Some examples of the memory system 704 are storage devices, such as RAM or ROM. The memory system 704 may comprise the RAM cache. In various embodiments, data is stored within the memory system 704. The data within the memory system 704 may be cleared or ultimately transferred to the storage system 706.

The storage system 706 is any storage configured to retrieve and store data. Some examples of the storage system 706 are flash drives, hard drives, optical drives, and/or magnetic tape. In some embodiments, the digital device 700 includes a memory system 704 in the form of RAM and a storage system 706 in the form of flash data. Both the memory system 704 and the storage system 706 comprise computer readable media which may store instructions or programs that are executable by a computer processor including the processor 702.

The communication network interface (com. network interface) 708 may be coupled to a data network (e.g., data network 164 or 1114) via a link. The communication network interface 708 may support communication over an Ethernet connection, a serial connection, a parallel connection, or an ATA connection, for example. The communication network interface 708 may also support wireless communication (e.g., 802.11a/b/g/n, WiMAX). It will be apparent to those skilled in the art that the communication network interface 708 may support many wired and wireless standards.

The optional input/output (I/O) interface 710 is any device that receives input from the user and output data. The optional display interface 712 is any device that may be configured to output graphics and data to a display. In one example, the display interface 712 is a graphics adapter.

It will be appreciated by those skilled in the art that the hardware elements of the digital device 700 are not limited to those depicted in FIG. 7. A digital device 700 may comprise more or less hardware elements than those depicted. Further, hardware elements may share functionality and still be within various embodiments described herein. In one example, encoding and/or decoding may be performed by the processor 702 and/or a co-processor located on a GPU.

In various embodiments, a digital device may be coupled to the voltmeter or other meter to detect a signal, detect one or more signal characteristics associated with the signal, track one or more positions of the receiving antenna and/or transmission antenna, and/or associate the one or more positions of the receiving antenna and/or transmission antenna with the detected one or more signal characteristics. In various embodiments, the digital device may make recommendations or control the receiving antenna based on detected signals, signal characteristics and past positioning to attain the desired position. As the aperture of the receiving or transmitting antennas is broadened and the radiation pattern narrowed, the digital device may search for a subsequent signal from the transmitting antenna by moving or making recommendations to move the receiving antenna until: 1) the subsequent signal is detected; and 2) the strongest or desired signal characteristics are attained. In various embodiments, the digital device may include a series of thresholds and may move or make recommendations to move the receiving element of the receiving antenna until a signal characteristic is at or above one or more thresholds. Further, the digital device may track the most likely receiving and/or transmission radiation patterns and make more accurate recommendations of moving or repositioning the receiving antenna based at least in part on the likely radiation patterns.

In various embodiments, the digital device may move the receiver element and/or receiving antenna through servos and/or motors (e.g., at the mounting bracket).

The above-described functions and components may be comprised of instructions that are stored on a storage medium such as a non-transitive computer readable medium. The instructions may be retrieved and executed by a processor. Some examples of instructions are software, program code, and firmware. Some examples of storage medium are memory devices, tape, disks, integrated circuits, and servers. The instructions are operational when executed by the processor to direct the processor to operate in accord with some embodiments. Those skilled in the art are familiar with instructions, processor(s), and storage medium.

Various embodiments are described herein as examples. It will be apparent to those skilled in the art that various modifications may be made and other embodiments can be used without departing from the broader scope of the present invention. Therefore, these and other variations upon the exemplary embodiments are intended to be covered by the present invention.

What is claimed is:

1. A method comprising:
   positioning a first parabolic antenna to a first position relative to a second parabolic antenna to receive a signal from the second parabolic antenna, the first position of the first parabolic antenna corresponding to a first antenna alignment orientation of the first parabolic antenna relative to the second parabolic antenna, the second parabolic antenna comprising:
   a first diaphragm coupled to a rim of the second parabolic antenna, the first diaphragm comprising a first energy absorbing material configured to modify a beamwidth of the signal from the second parabolic antenna to a first beamwidth value; and
   a second diaphragm coupled to the rim of the second parabolic antenna, the second diaphragm comprising a second energy absorbing material configured to modify the beamwidth of the signal from the second parabolic antenna to a second beamwidth value less than the first beamwidth value;

moving the first parabolic antenna relative to the first position, while using a meter coupled to the first parabolic antenna to measure a signal characteristic of the signal;

repositioning the first parabolic antenna to a second position relative to the second parabolic antenna after detecting an acceptable threshold in the signal characteristic of the signal, the second position of the first parabolic antenna corresponding to a second antenna alignment orientation of the first parabolic antenna relative to the second parabolic antenna;

removing the first diaphragm to expose the second diaphragm and to modify the beamwidth of the signal from the second parabolic antenna to the second beamwidth value;

moving the first parabolic antenna relative to the second position, after the first diaphragm has been removed, while using the meter to measure the signal characteristic of the signal from the second parabolic antenna; and repositioning the first parabolic antenna to a third position relative to the second parabolic antenna after detecting an improvement in the signal characteristic of the narrowed signal over the acceptable threshold, the third position of the first parabolic antenna corresponding to a third antenna alignment orientation of the first parabolic antenna relative to the second parabolic antenna, and the third position of the first parabolic antenna causing improved communication with the second parabolic antenna relative to the second position of the first parabolic antenna.

2. The method of claim 1, wherein the signal characteristic includes signal gain.

3. The method of claim 1, further comprising configuring an antenna mount to reposition the first parabolic antenna relative to the second parabolic antenna based on a maximum or minimum signal characteristic of the narrowed signal.

4. The method of claim 1, wherein the first energy absorbing material narrows an aperture of the second parabolic antenna to broaden the beamwidth of the signal from the second parabolic antenna.

5. The method of claim 1, wherein one or more of the first diaphragm and the second diaphragm is adhered to the rim of the second parabolic antenna.

6. The method of claim 1, wherein the energy absorbing material is adhered to a reflector of the second parabolic antenna.

7. The method of claim 6, wherein the reflector comprises a parabolic reflector.

8. The method of claim 1, wherein the signal characteristic comprises one of a Received Signal Strength Indicator (RSSI) and a Received Signal Level of the signal.

9. The method of claim 1, wherein the meter comprises a voltmeter configured to measure a voltage associated with a signal characteristic of an Outdoor Unit (ODU) coupled to the first parabolic antenna.

10. The method of claim 1, wherein the first parabolic antenna and the second parabolic antenna are used in a microwave antenna communications system comprising a point-to-point transmission system.

11. The method of claim 1, wherein the first energy absorbing material is not the same as the second energy absorbing material.

12. A first parabolic antenna configured to be:

positioned to a first position relative to a second parabolic antenna to receive a signal from the second parabolic antenna, the first position of the first parabolic antenna corresponding to a first antenna alignment orientation of the first parabolic antenna relative to the second parabolic antenna, the second parabolic antenna comprising:

a first diaphragm coupled to a rim of the second parabolic antenna, the first diaphragm comprising a first energy absorbing material configured to modify a beamwidth of the signal from the second parabolic antenna to a first beamwidth value; and a second diaphragm coupled to the rim of the second parabolic antenna, the second diaphragm comprising a second energy absorbing material configured to modify the beamwidth of the signal from the second parabolic antenna to a second beamwidth value less than the first beamwidth value;

moved relative to the first position, while using a meter coupled to the first parabolic antenna to measure a signal characteristic of the signal;

repositioned to a second position relative to the second parabolic antenna after detecting an acceptable threshold in the signal characteristic of the signal, the second position of the first parabolic antenna corresponding to a second antenna alignment orientation of the first parabolic antenna relative to the second parabolic antenna;

moved relative to the second position, after the first diaphragm has been removed, while using the meter to measure the signal characteristic of the signal from the second parabolic antenna; and repositioned to a third position relative to the second parabolic antenna after detecting an improvement in the signal characteristic of the narrowed signal over the acceptable threshold, the third position of the first parabolic antenna corresponding to a third antenna alignment orientation of the first parabolic antenna relative to the second parabolic antenna, and the third position of the first parabolic antenna causing improved communication with the second parabolic antenna relative to the second position of the first parabolic antenna.

13. The first parabolic antenna of claim 12, wherein the signal characteristic includes signal gain.

14. The first parabolic antenna of claim 12, wherein the first parabolic antenna is configured to be repositioned relative to the second parabolic antenna based on a maximum or minimum signal characteristic of the narrowed signal.

15. The first parabolic antenna of claim 12, wherein the first energy absorbing material narrows an aperture of the second parabolic antenna to broaden the beamwidth of the signal from the second parabolic antenna.

16. The first parabolic antenna of claim 12, wherein one or more of the first diaphragm and the second diaphragm is adhered to the rim of the second parabolic antenna.

17. The first parabolic antenna of claim 12, wherein the first energy absorbing material is adhered to a reflector of the second parabolic antenna.

18. The first parabolic antenna of claim 17, wherein the reflector comprises a parabolic reflector.

19. The first parabolic antenna of claim 12, wherein the signal characteristic comprises one of a Received Signal Strength Indicator (RSSI) and a Received Signal Level of the signal.

20. The first parabolic antenna of claim 12, wherein the meter comprises a voltmeter configured to measure a voltage associated with a signal characteristic of an Outdoor Unit (ODU) coupled to the first parabolic antenna.

21. The first parabolic antenna of claim 20, wherein the first parabolic antenna and the second parabolic antenna are used in a microwave antenna communications system comprising a point-to-point transmission system.

22. The first parabolic antenna of claim 12, wherein the first energy absorbing material is not the same as the second energy absorbing material.

23. A method comprising:
   positioning a first parabolic antenna to a first position relative to a second parabolic antenna to receive a signal from the second parabolic antenna, the first position of the first parabolic antenna corresponding to a first antenna alignment orientation of the first parabolic antenna relative to the second parabolic antenna, the second parabolic antenna comprising:
      a first diaphragm coupled to a rim of the second parabolic antenna, the first diaphragm comprising a first energy absorbing material configured to modify a beamwidth of the signal from the second parabolic antenna to a first beamwidth value; and
      a second diaphragm coupled to the rim of the second parabolic antenna, the second diaphragm comprising a second energy absorbing material configured to modify the beamwidth of the signal from the second parabolic antenna to a second beamwidth value less than the first beamwidth value;
   moving the first parabolic antenna relative to the first position, while using a meter coupled to the first parabolic antenna to measure a signal characteristic of the signal;
   repositioning the first parabolic antenna to a second position relative to the second parabolic antenna after detecting an acceptable threshold in the signal characteristic of the signal, the second position of the first parabolic antenna corresponding to a second antenna alignment orientation of the first parabolic antenna relative to the second parabolic antenna;
   removing at least some of the energy absorbing material from the second parabolic antenna to narrow the beamwidth of the signal;
   removing the first diaphragm to expose the second diaphragm and to modify the beamwidth of the signal from the second parabolic antenna to the second beamwidth value;
   moving the first parabolic antenna relative to the second position after the first diaphragm has been removed, while using the meter to measure the signal characteristic of the signal from the second parabolic antenna; and
   repositioning the first parabolic antenna to a third position relative to the second parabolic antenna after detecting an improvement in the signal characteristic of the narrowed signal over the acceptable threshold, the third position of the first parabolic antenna corresponding to a third antenna alignment orientation of the first parabolic antenna relative to the second parabolic antenna, and the third position of the first parabolic antenna causing improved communication with the second parabolic antenna relative to the second position of the first parabolic antenna.

24. The method of claim 23, wherein the first energy absorbing material is not the same as the second energy absorbing material.

* * * * *